United States Patent [19]
Dromgoole et al.

[11] Patent Number: 5,747,982
[45] Date of Patent: May 5, 1998

[54] MULTI-CHIP MODULES WITH ISOLATED COUPLING BETWEEN MODULES

[75] Inventors: Douglas John Dromgoole, San Diego, Calif.; Anatoly Feygenson, Hillsboro; Robert Charles Frye, Piscataway, both of N.J.; Ashraf Wagih Lotfi, Rowlett, Tex.; King Lien Tai, Berkeley Heights, N.J.

[73] Assignee: Lucent Technologies Inc., Murray Hill, N.J.

[21] Appl. No.: 761,047

[22] Filed: Dec. 5, 1996

[51] Int. Cl.⁶ ............................ G05F 5/00; H03H 7/00
[52] U.S. Cl. ..................... 323/902; 363/147; 361/818; 361/782
[58] Field of Search ..................... 323/902; 363/147; 361/818, 782, 399; 257/724, 728; 333/172, 185

[56] References Cited

U.S. PATENT DOCUMENTS 5,063,489 11/1991 Inaba ........................................... 363/21
5,165,055 11/1992 Metsler ........................................ 333/12
5,475,579 12/1995 John et al. ................................. 323/902
5,491,405 2/1996 Schroder-Brumloop et al. ...... 323/299

Primary Examiner—Stuart N. Hecker
Assistant Examiner—Rajnikant B. Patel
Attorney, Agent, or Firm—Glen E. Books, Esq.

[57] ABSTRACT

A silicon-on-silicon dual MCM apparatus comprising a printed circuit board having a voltage isolation boundary contained therein supporting a pair of multi-chip modules on either side of the voltage isolation boundary. The MCMs safely convey signals across the isolation boundary via discrete optical coupling means or the like. The optical coupling means allow safe and efficient conveyance of signals across the voltage isolation boundary enabling a designer to group high voltage components on one side of the boundary and low voltage components on the other side of the boundary. This obviates to a degree the need for multi-layered PCBs. A relatively large number of passive components (resistors and capacitors) are integrated into a silicon substrate with flip-chip analog integrated circuits (ICs). Operational characteristics of the controller are verified after integration and are compared to the discrete version. High voltage isolation requirements, interference, and noise are all considered to determine the most critical portions of the dual MCM layout and design.

11 Claims, 4 Drawing Sheets

MULTI-CHIP MODULES WITH ISOLATED COUPLING BETWEEN MODULES

BACKGROUND OF THE INVENTION

1. Field of the Invention

The present invention is directed to silicon-on-silicon multichip modules (MCMs) utilizing isolation coupling across a voltage isolation boundary within a printed circuit board (PCB).

2. Description of Related Art

In the construction of complex circuits such as controllers for power circuits, a variety of analog feedback circuits are used to provide tight regulation for voltage and loading conditions. Such circuits ensure that the power circuit and its loads are suitably protected during transient and steady state operating conditions. Many of these regulation functions are readily implemented using active components like op-amps and comparators in conjunction with appropriate timing signals and waveforms. Since large portions of these active component configurations are repeatedly used, integrated circuit (IC) manufacturers have developed specialized ICs which combine several of the required functions. A full featured controller can contain upwards of ten (10) different ICs along with a variety of active and passive components resulting in a very large component count and a densely populated, complex (multi-layered) circuit board.

To reduce the circuit board size and component count, further integration is required. Complete silicon integration, however, requires custom design for specific applications. This obviously hinders the flexibility of using such an IC in other applications since it is designed for a specific purpose rather than as a more generic component. Complete integration is not economical since high unit volumes of a specific IC would not likely be required. A more flexible and less costly approach is to include a portion of the original circuit in a low cost silicon substrate with commercial ICs mounted on the substrate surface.

The foregoing considerations led to the design and use of multi-chip modules for circuit integration. A multi-chip module is essentially a chip housing having a ceramic base containing two or more chips closely connected with high density lead lines. The advantage of multi-chip module design is its ability to save space and to speed processing due to the short leads between the chips. Further description and discussion of multi-chip circuitry can be found in U.S. Pat. No. 5,534,465 incorporated herein by reference.

Single MCM designs, however, can not provide safe and efficient operating characteristics for certain applications which require large voltage protections among chips requiring significantly disparate operating voltages. In the power controller example, a voltage isolation of 500 volts between chips is required for safe operation. This is highly impractical for a single MCM unit. Accordingly, there is a need for a new arrangement for employing MCMs in power circuits.

SUMMARY OF THE INVENTION

The present invention is a silicon-on-silicon dual MCM apparatus. A dual MCM design with discrete isolation coupling removes the dielectric withstand constraints of each MCM while maintaining high voltage capabilities. The apparatus comprises a printed circuit board having a voltage isolation boundary and a pair of multi-chip modules on either side of the voltage isolation boundary. The MCMs are designed and implemented to safely convey signals across the isolation boundary via discrete coupling components (e.g. opto-couplers, transformers). The isolation coupling allows safe and efficient conveyance of signals across the voltage isolation boundary enabling a designer to group high voltage components on one side of the boundary and low voltage components on the other side of the boundary.

The preferred embodiment is an isolated mixed signal power controller operating at a high voltage DC input (typically, 36–72 volts), and providing a low voltage DC output (typically 5 volts at 30A). The controller contains a power circuit for converting the DC input voltage to an AC signal using switched power MOSFETs and a power transformer for voltage step-down and voltage isolation between the primary and secondary sides. The controller also contains a control circuit for providing a tightly regulated output voltage, monitoring current and voltage levels, and remote power switching control. The control circuit is implemented using various ICs on the primary and secondary sides of the power circuit. Control of the output voltage is achieved using pulse width modulation (PWM) of the duty cycle of the MOSFET switches in the power circuit.

DETAILED DESCRIPTION

Figure 1:
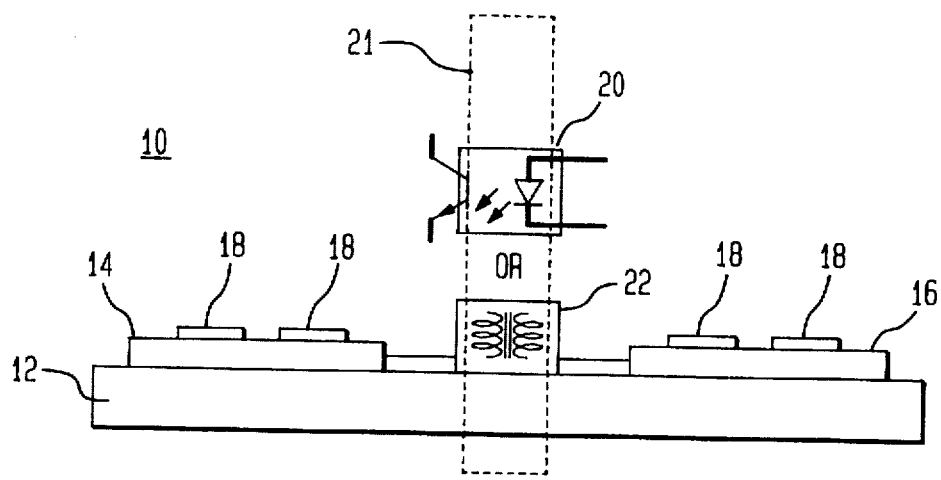
FIG. 1 illustrates the major block components of a multi-chip module design.

FIG. 1 shows the main components of a multi-chip module device 10 in which a circuit board 12 has a pair of multi-chip modules (MCMs) 14 and 16 mounted thereon. Each MCM includes a plurality of integrated circuit (IC) chips 18. The number of ICs will depend on the specific application of the unit. MCM 14 is the primary side MCM and houses the high voltage circuit components while MCM 16 is the secondary side MCM and houses the low voltage circuit components. The two MCMs are coupled over an isolation boundary 21 via an opto-coupler 20 or an isolation transformer 22.

FIGS. 2-7 illustrate a preferred embodiment of the device useful as a mixed signal power controller. There are five (5) ICs which are flip-chip mounted on the primary side MCM. They include a PWM controller, a timer, an under-voltage lockout (UVLO) detector, gate drive buffers, and an op-amp. The secondary side MCM has two (2) op-amp ICs mounted on the Si substrate. A low power internal bias supply is used to power the control circuit and an under voltage lockout (UVLO) circuit is used to initiate proper startup sequencing upon application of input power.

Figure 2:
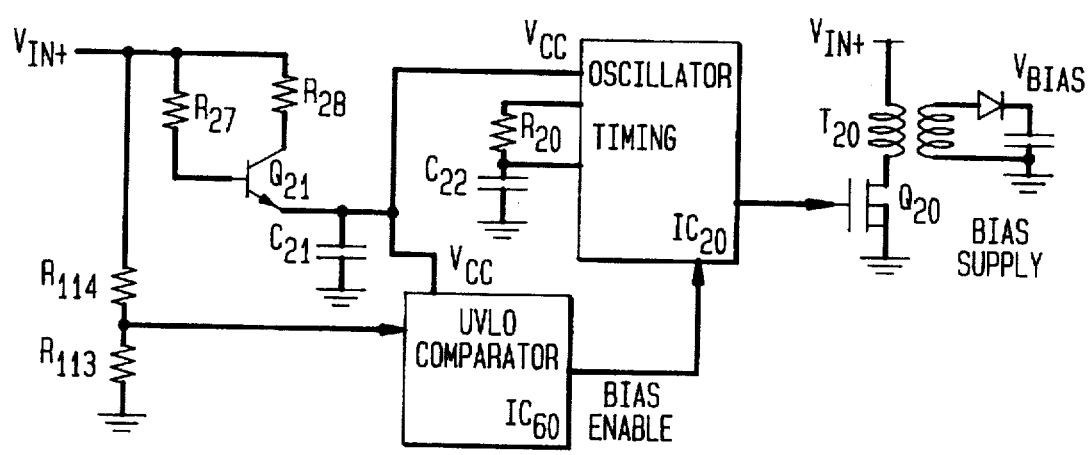
FIG. 2 illustrates the undervoltage lockout and internal bias supply of the primary side MCM of a preferred embodiment of a mixed signal power controller MCM design.

FIG. 2 illustrates the under-voltage lockout and internal bias supply of the primary side MCM. When power is applied at $V_{in+}$ then transistor $Q_{21}$ and resistors $R_{27}$ and $R_{28}$ develop local supply voltage $V_{cc}$. This powers the oscillator ($IC_{20}$) and under voltage lockout (UVLO) comparator ($IC_{60}$) chips. Before the oscillator is allowed to start up, the UVLO comparator indicates that $V_{in+}$ has risen to the lower limit of an allowed input voltage range. $V_{in+}$ is measured through resistor divider $R_{114}$ and $R_{113}$. Once $V_{in+}$ is within the allowed range, the UVLO output (bias enable) goes high allowing the oscillator to switch on. The frequency of oscillation is controlled by the timing set of resistor $R_{20}$ and capacitor $C_{22}$ which drives the internal bias power supply through switch $Q_{20}$ and transformer $T_{20}$. Transformer $T_{20}$ supplies the necessary regulated bias power to the remaining chips of the controller.

Figure 3:
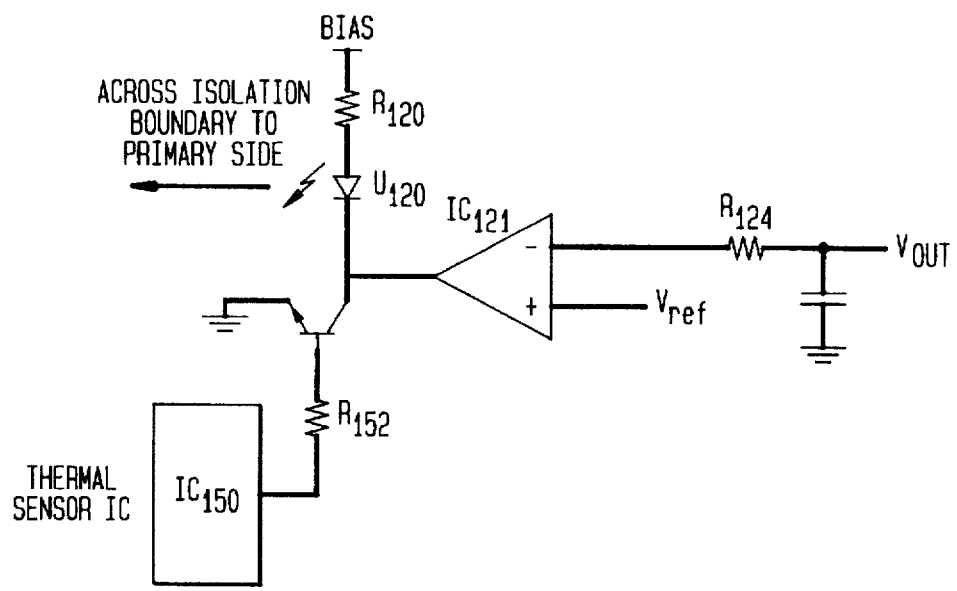
FIG. 3 illustrates the overvoltage protection and thermal shutdown of the secondary side MCM of the preferred embodiment.

FIG. 3 illustrates the over-voltage protection and thermal shutdown of the secondary side MCM. The output voltage $V_{out}$ of the power supply is monitored through comparator ($IC_{121}$) which trips if the voltage exceeds a predetermined reference value. This sends a signal through the secondary side opto-coupler $U_{120}$ to the primary side MCM for protective action. Additionally, thermal sensor ($IC_{150}$) also sends a signal to the primary side MCM for protective action via opto-coupler $U_{120}$ if the temperature exceeds a preset limit.

Figure 4:
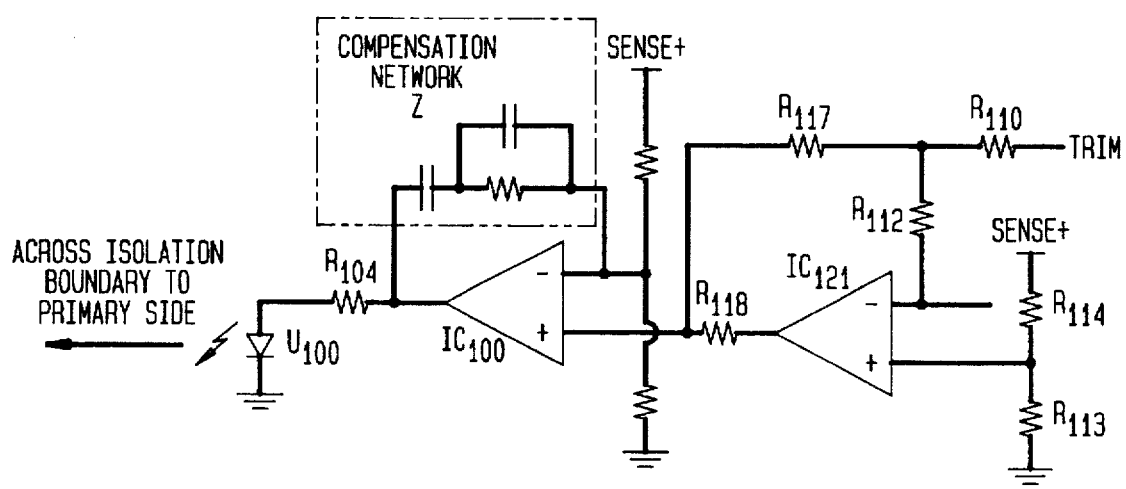
FIG. 4 illustrates the output voltage trim and error amplifier of the secondary side MCM of the preferred embodiment.

FIG. 4 illustrates the output voltage trim and error amplifier of the secondary side MCM. A trim pin allows the user to set the output voltage $V_{out}$ to a desired value by adjusting the voltage applied to the non-inverting terminal of amplifier ($IC_{100}$) via amplifier ($IC_{121}$.) An output voltage feedback loop begins with a sensed output voltage level (sense$_+$). The sense$_+$ voltage is compensated for by amplifier ($IC_{100}$) using compensation network Z. The error signal from ($IC_{100}$) passes through resistor $R_{104}$ before being sent to the primary side MCM 14 via opto-coupler $U_{100}$.

Figure 5:
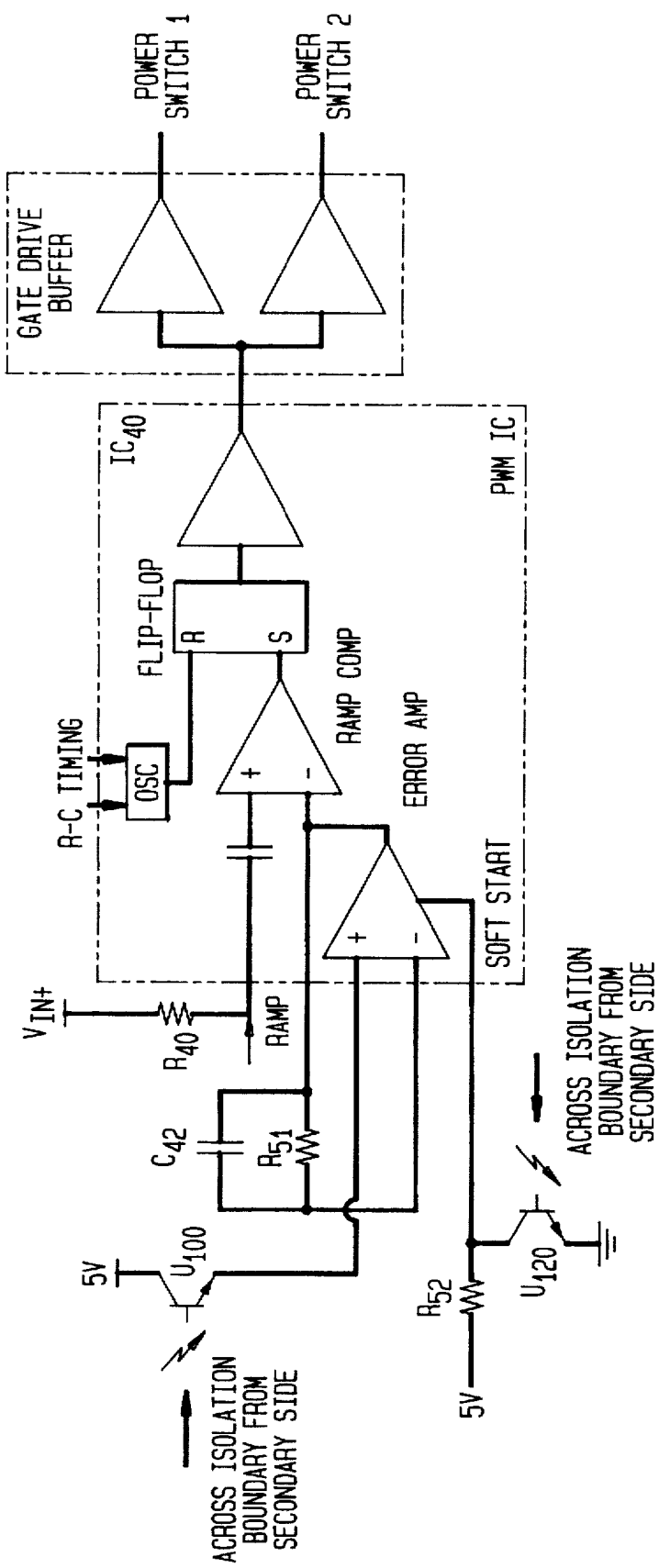
FIG. 5 illustrates the pulse-width modulator and gate drive of the primary side MCM of the preferred embodiment.

FIG. 5 illustrates the pulse-width modulator and gate driver of the primary side MCM. The secondary side error signal is received through opto-coupler $U_{100}$ and fed to the internal amplifier ($IC_{40}$) within the pulse-width modulator (PWM). Compensation network $C_{42}$ and $R_5$, regulates the input to the inverted terminals of the error amplifier and ramp comparator in ($IC_{40}$). The error amplifier output is compared to the ramp input of the ramp comparator. The result is a set-signal for an R-S flip-flop at the proper instant which corresponds to the necessary duty cycle (or pulse-width). The output PWM square wave is then buffered to the chip output and drives the high current gate drive buffer chip capable of driving the gates of the power switches. The overvoltage and/or thermal shutdown signal(s) from the secondary side MCM are received through $U_{120}$ thereby overriding the error amplifier input to force a soft-start condition having a reduced duty cycle (or pulse-width) that reduces the output voltage.

Figure 6:
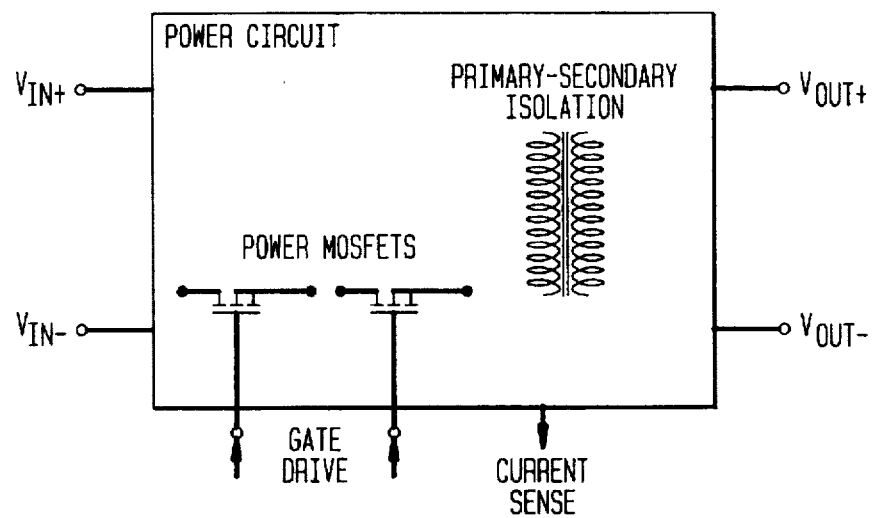
FIG. 6 illustrates the main operational sections of the power circuit of the preferred embodiment.
Figure 7:
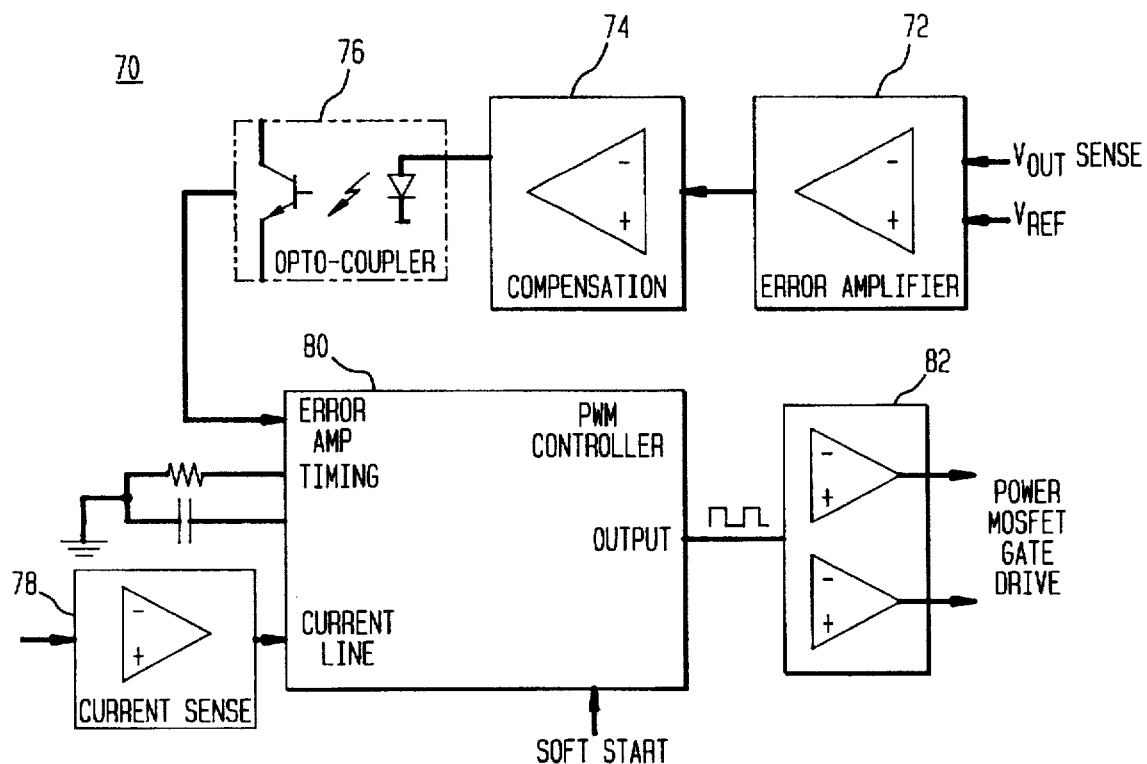
FIG. 7 illustrates the main voltage and current feedback loops used to control the power circuit of the preferred embodiment.

FIG. 7 shows the main voltage and current feedback loops used to control the power circuit of FIG. 6. The feedback loop senses and scales the output voltage $V_{out}^{sense}$ before comparing same to a reference voltage $V_{ref}$. An error amplifier 72 then provides a signal proportional to the difference between $V_{out}^{sense}$ and $V_{ref}$. The error signal is fed to a compensation op-amp 74 to achieve the desired closed loop dynamic behavior. This compensated error signal which has been generated on the secondary side MCM is now conveyed over the voltage isolation boundary of circuit board 12 to the primary side MCM via opto-coupler 76. A pulse-width modulator PWM controller IC 80 mounted on the primary side MCM utilizes the conveyed error signal along with a signal generated from the current sense circuit 78 in the power circuit to produce the duty cycle. This is accomplished by means of a triangular wave form which when compared to the composite error signal produces a square wave low level drive signal having a duty cycle dependent on the error signal level. This low level drive signal is supplied to the power MOSFET gates 82 through a high current buffer chip and drive circuit.

The specific startup procedure of the dual MCM design is as follows. The input voltage $V_{in+}$ rises from zero and switches the control circuit on when the minimum voltage threshold is reached. As $V_{in+}$ falls below the minimum threshold the control circuit is switched off. Triangular signals are generated by PWM oscillator and the timer IC on the primary side MCM. The PWM oscillator generates the duty cycle which provides regulated output. The timer IC is used to drive the bias supply, which is essential for all the ICs in both MCMs. The oscillator switches on when when the turn-on signal of the UVLO is enabled. Initially, the primary side MCM provides zero PWM output to avoid sudden turn-on. Shortly after, the error amplifier is enabled and begins to sense the signal from the secondary side MCM indicating no output voltage. The signal is integrated yielding a rising error signal that eventually intersects the triangular waveform thereby starting PWM switching. This begins the switching action of the power MOSFETs producing a rising output voltage. The PWM waveform settles to a steady state as the error amplifier output signal arrives at its steady state value.

A dual MCM design was adopted since part of the control function is performed on the secondary side and part is performed on the primary side, with an isolation requirement between sides. A dual MCM design is favored over a single MCM design because a single MCM would have to provide for a 500 volt isolation between the primary and secondary circuits. Using two MCMs, however, removes the dielectric withstand constraints from each MCM while maintaining high voltage abilities through the use of opto-couplers as discrete parts.

The silicon substrate for each of the MCMs allows for integrated resistors and capacitors. The resistors are formed from Ta—Si films providing $2\omega$/square. The capacitors are formed using Ta—Si as the bottom electrode and depositing $Si_3N_4$ as the dielectric layer, resulting in a capacitor density of $33nF/cm^2$. The top electrode is formed from the first aluminum metallization layer. The technology used to make these components results in a maximum voltage of 40 volts. This is adequate for both the primary and secondary circuits under a dual MCM design but is clearly inadequate for a single MCM design 500 volt withstand requirement.

Most of the passive discrete circuit components can be integrated into the silicon substrates. Large capacitors (those in excess of 1nF), however, cannot be integrated due to substrate size limitations. Some capacitance values associated with RC time constants can be reduced from their discrete circuit values by increasing the associated resistor value. It is possible to determine the values of resistance and capacitance that would minimize the silicon space occupied for a given RC time constant. Resistors with values ranging from 5 $\omega$ to 200 k$\omega$ are feasible for the given space constraints.

Of ten (10) ICs used in the discrete circuit, seven (7) are integrated into the flip-chip MCMs. The remaining three (3) are precision reference ICs and solid-state temperature sensors which remain as packaged ICs to guarantee the manufacturer's specifications. These specifications are crucial to accurate regulation limits and over temperature shutdown. The five (5) ICs on the primary side are flip-chip mounted on the primary side MCM and include a PWM controller, a timer, an under-voltage lockout (UVLO) detector, gate drive buffers, and an op-amp. The secondary side MCM has two (2) op-amp ICs mounted on the Si substrate.

The commercial ICs were obtained in wafer form and re-processed to provide a solder wettable metallization and to re-route the fine pitch wire bond pads to SMT compatible solder pads. The peripheral wire bond pads, with a typical 5 mil pitch are now laid out in an area array with a 16 mil or more pitch. This relaxed spacing allows these ICs to be assembled by surface mount techniques using stencil printed fine pitch solder paste on the surface of the Si substrate wafer. This requires a three (3) layer process over the IC wafer surface (2 polymides and an aluminum) in addition to a solder wettable finish over the aluminum. After processing, the IC wafers are diced and placed into specially modified flip-trays which have cavities on their top and bottom surfaces (waffle packs). Thus, flipping the tray filled with die facing up becomes die facing down. The die are ready for inverted pick and place out of the waffle packs.

The dual MCM approach results in a reduced component count when compared to a discrete version approach as exemplified in the following table.

| Component Type | Discrete version | MCM version |
| --- | --- | --- |
| Capacitors | 40 | 19 |
| Resistors | 74 | 10 |
| ICs | 10 | 5 |
| Total | 124 | 34 |

The resulting MCMs measured 5.9 mm by 6.6 mm (primary) and 2.5 mm by 4.2 mm (secondary). Thus, the total controller board size is reduced from 28 cm² (discrete version) to 13 cm² (MCM version) yielding a space saving of 54%. The total component count has been reduced from 124 to 34, a 73% reduction. Further, the discrete version required EMI shielding and four (4) layer printed circuit board (PCB) implementation. The MCM version is simplified to a double sided PCB implementation.

There are fewer problems with respect to noise and interference in the MCM version as compared to the discrete version. Noise source coupling in the PWM is weaker than in standard PWMs due to the smaller loop areas on the silicon substrate and the shielding effect of the grounded MCM substrates. In this particular application, noise coupling can result in improperly timed signals which is most crucial to the two power MOSFETs since neither should ever conduct simultaneously. If the power MOSFETs were to conduct at the same time it would create a short across the input high voltage bus. The circuit is designed to provide a dead time between these two signals to ensure that only one power device is active at any given moment. In the presence of noise, however, it is possible to shift timing so an overlap occurs which usually results in immediate destruction of the power devices. Proper timing is maintained in the drive signals generated by the gate drive buffers by ensuring that one device is fully switched off prior to switching the other device on.

To prevent these problems in the discrete version , EMI decoupling capacitors and a four (4) layer PCB having shielding planes are required. Elimination of individual packaging and its associated parasitic impedances reduces switching noise levels in MCM based digital designs. For the present analog design, individual decoupling capacitors for each IC are eliminated and replaced with a single capacitor for each MCM. Further, the shielding planes used in the discrete version were eliminated resulting in a simpler two (2) layer design.

While specific embodiments of the invention are shown and described in this application, the invention is not limited to these particular forms. The invention also applies to further modifications and improvements that do not depart from the spirit and scope of this invention.

We claim:

1. A silicon-on-silicon dual multi-chip module apparatus comprising:

a circuit board having a voltage isolation boundary;

a pair of multi-chip modules commonly disposed on said circuit board for use as a single coupled circuit, wherein said pair of multi-chip modules comprises a primary side multi-chip module and a secondary side multi-chip module;

said primary side multi-chip module mounted on said circuit board on one side of said voltage isolation boundary, said primary side multi-chip module including at least one integrated circuit chip;

said secondary side multi-chip module mounted on said circuit board on the other side of said voltage isolation boundary, said secondary side multi-chip module including at least one integrated circuit chip; and an isolation coupling device for transmitting and receiving signals between said primary and secondary side multi-chip modules across said voltage isolation boundary.

2. The apparatus of claim 1 wherein said primary side multi-chip module houses high voltage integrated circuit chips and said secondary side multi-chip module houses low voltage integrated circuit chips.

3. The apparatus of claim 2 wherein said apparatus is a mixed signal power controller comprising:

a power circuit for converting a high input voltage on said primary side multi-chip module to a low output voltage on said secondary side multi-chip module; and a control circuit for monitoring voltage and current levels of said power circuit and providing a regulated output voltage of said power circuit.

4. The mixed signal power controller of claim 3 wherein said power circuit comprises:

at least one switched power MOSFET for converting a dc input signal to an ac signal; and a power transformer for voltage step down.

5. The mixed signal power controller of claim 4 wherein said control circuit comprises:

an error op-amp integrated circuit chip mounted on said secondary side multi-chip module for receiving the output voltage and a reference voltage and providing an error signal proportional to the difference between the output voltage and said reference voltage;

a compensation op-amp integrated circuit chip coupled to said error op-amp for receiving and compensating said error signal yielding a compensated error signal; and a pulse-width modulation controller integrated circuit chip mounted on said primary side multi-chip module for receiving said compensated error signal via said isolation coupling device and producing a duty cycle for said at least one power circuit MOSFET.

6. The mixed signal power controller of claim 5 further including an undervoltage lockout comparator integrated circuit chip on said primary side multi-chip module for preventing said power controller from operating when said input voltage is below a pre-determined threshold level.

7. The mixed signal power controller of claim 6 further including an over-voltage comparator integrated circuit chip on said secondary side multi-chip module which monitors the output voltage and sends a shutdown signal via said isolation coupling device to said primary side multi-chip module when said output voltage exceeds a pre-determined threshold level.

8. The mixed signal power controller of claim 7 further including a thermal sensor integrated circuit chip on said secondary side multi-chip module which monitors the temperature and sends a shutdown signal via said isolation coupling device to said primary side multi-chip module when said temperature exceeds a predetermined threshold level.

9. The apparatus of claim 1 wherein said isolation coupling device comprises an opto-coupler.

10. The apparatus of claim 1 wherein said isolation coupling device comprises an isolation transformer.

11. A silicon-on-silicon dual multi-chip module apparatus comprising:

a substrate having a voltage isolation boundary;

a pair of multi-chip modules commonly housed on said substrate, wherein said pair of multi-chip modules comprises a primary side multi-chip module and a secondary side multi-chip module;

said primary side multi-chip module mounted on said substrate on one side of said voltage isolation boundary, said primary side multi-chip module including at least one integrated circuit chip;

said secondary side multi-chip module mounted on said substrate on the other side of said voltage isolation boundary, said secondary side multi-chip module including at least one integrated circuit chip; and an isolation coupling device for transmitting and receiving signals between said primary and secondary side multi-chip modules across said voltage isolation boundary.

\* \* \* \* \*